United States Patent
Mussenden

[11] Patent Number: 5,774,315
[45] Date of Patent: Jun. 30, 1998

[54] POWER SURGE SUPPRESSION CIRCUIT FOR HOT PLUG ENVIRONMENTS

[75] Inventor: Georg A. Mussenden, Boca Raton, Fla.

[73] Assignee: CORE Engineering, Inc., Boca Raton, Fla.

[21] Appl. No.: 699,488

[22] Filed: Aug. 19, 1996

[51] Int. Cl.⁶ ........................................ H02H 9/06
[52] U.S. Cl. ........................ 361/18; 361/118; 323/908; 307/86; 307/87
[58] Field of Search ............................ 361/111, 118, 361/58, 18; 323/908; 307/71, 85–87

[56] References Cited

U.S. PATENT DOCUMENTS

| | | | |
|---|---|---|---|
| 5,155,648 | 10/1992 | Gauthier | 361/58 |
| 5,272,584 | 12/1993 | Austruy et al. | 361/58 |
| 5,587,685 | 12/1996 | Johansson | 327/546 |

OTHER PUBLICATIONS

Siliconix Inc., release in ECN Electronic Component News, vol. 40, No. 8, Aug. 1996.

*Primary Examiner*—Fritz Fleming
*Assistant Examiner*—Michael Sherry
*Attorney, Agent, or Firm*—Graham & James LLP

[57] ABSTRACT

A surge suppression circuit for gradually charging a capacitance of a device being hot plugged into a system, such as a disk drive being hot plugged into a RAID system. Without reliance on a permanently turned-on series element, such as a pass transistor, the surge suppression circuit uses a trigger circuit in combination with either a current limiting circuit or a slew rate control circuit. The current limiting circuit relies on a current sensing resistor in combination with a transistor that turns on when a voltage reaches a certain level across the current sensing resistor. The slew rate control circuit relies on a feedback mechanism that includes a capacitor and a resistor for maintaining a substantially constant rate of charging the capacitance of the device being hot plugged.

31 Claims, 6 Drawing Sheets

POWER SURGE SUPPRESSION CIRCUIT FOR HOT PLUG ENVIRONMENTS

BACKGROUND OF THE INVENTION

Some systems have hot plug capability of certain devices. Hot plugging means that a device can be electrically connected to the system, while the system is powered up and operating. A device being hot plugged into a system may have significant capacitance relative to any power supplies of the system. The capacitance of the device may be discharged at the time that the device is being hot plugged. As a result, the capacitance of the device may draw significant current from the system into which the device is being hot plugged.

Power supplies have a limited capacity to supply current to the components of a system. Consequently, hot plugging a device into a system can cause current and voltage levels to suddenly drop in components of the system. Such drops in voltages can disrupt operation and damage the system.

An example of a system that has hot plug capability is a RAID system. RAID stands for redundant arrays of inexpensive disks. RAID systems have two or more disk drives that cooperate to increase performance and fault tolerance. If one of the disk drives of a RAID system fails, it can be replaced by another disk drive. The replacement disk drive can be hot plugged into the RAID system. Typically, disk drives include relatively large power bypass capacitors. The purpose of such capacitors is to remove noise from power supplies. Such capacitors in a disk drive can be, for example, 200 micro-farads ($\mu$F).

Hot plugging one disk drive can cause voltage (and current) drops in neighboring disk drives. Following such voltage drops, the neighboring disk drives may shut down their operations. When shutting down, these neighboring disk drives retract, i.e. park, their magnetic heads. They also bring to a stop their spinning disks. Once voltage is restored to these neighboring disk drives, then these disk drives spin up again their disks prior to becoming fully operational. The process of parking magnetic heads, braking and spinning up of the disks can take as much as about 15 seconds. So, for about 15 seconds these neighboring disk drives are unavailable to the RAID system. This unavailability of disk drives is a significant interruption to the performance of the RAID system.

Furthermore, voltage drops in neighboring disk drives due to hot plugging of one disk drive can also slow down the operation of circuitry associated with the neighboring disk drives. In particular, operation of CMOS (Complimentary Symmetry Metal-Oxide-Semiconductor) devices tends to slow down with a drop in voltage, since less voltage (and current) is available for charging internal and external capacitances of the CMOS devices. Thus, the CMOS devices may be unable to maintain operation at a speed set by a clock, such as a crystal oscillator, thereby significantly impairing the operation of the circuit containing the CMOS devices.

To avoid the above discussed current and voltage drops, RAID systems usually gradually charge the power bypass capacitors of the disk drive being hot plugged. To achieve gradual charging of the power bypass capacitors, typical RAID systems use charge up circuits. Such charge up circuits usually employ a rather large series pass MOSFET transistor (Metal-Oxide-Semiconductor Field-Effect transistor). Additionally, such charge up circuits typically include charge pumps to generate a voltage to drive the MOSFET pass transistor.

When a disk drive is hot plugged into a typical RAID system, a circuit of the disk drive is connected in series with a pass transistor. The charge up circuit of the typical RAID system slowly turns on the pass transistor to gradually charge the disk drive's power bypass capacitance. Even after the power bypass capacitor has been fully charged, the pass transistor remains turned on. Otherwise, the RAID system would be unable to supply power to that circuit of the disk drive, because the pass transistor is in series with that circuit.

Usually disk drives have fairly tight tolerances of only plus or minus 5% deviation from a nominal power supply voltage provided by the RAID system. To ensure that there is relatively little voltage drop across the pass transistor, the pass transistor is of sufficient size to provide a low series resistance to the disk drive. However, large pass transistors require significant amount of space. Moreover, large pass transistors typically are secured with a screw instead of simply being soldered to, for example, a circuit backplane. All of the power supplied by the power supply to the RAID system's particular disk drive circuit passes through this pass transistor. Consequently, should this pass transistor fail, power to that circuit of the disk drive is cut off, rendering that circuit and possibly the entire disk drive useless.

SUMMARY OF THE INVENTION

The invention includes a surge suppression circuit for hot plugging a device into a system for gradually powering up the device. This surge suppression circuit permits gradual charging up of a device's relatively large capacitance without a permanently in series device, such as a physically large pass transistor. A pass transistor can fail and thus disconnect the device from a system's power supply. Instead, this embodiment uses a relatively small, not permanently in series power transistor. Moreover, this embodiment uses a single power connection to trigger the charging of a device's capacitance and to actually charge the device's capacitance.

Component values in the surge suppression circuit of the invention are selected to keep any voltage drops in the system's power supply voltage to values low enough, so as not to be of consequence to the system's operation. Such selection of component values allows this surge suppression circuit to gradually and sufficiently charge the device's capacitance, while avoiding sudden increases in power requirements from the system's power supply.

From a system point of view, a preferred embodiment of the invention is an apparatus for charging a capacitance having a first and a second potentials operable with a power supply having a first and a second potentials. The apparatus comprises a trigger circuit for coupling to the capacitance and for coupling to the power supply. The apparatus further comprises a current control circuit coupled to the trigger circuit, the current control circuit for coupling to the capacitance and for coupling to the power supply.

From a process point of view, a preferred embodiment of the invention is a process for charging a capacitance having a potential operable with a power supply having another potential. The process comprises the following steps. Generating a trigger signal based on the capacitance being coupled to the power supply. Following the generation of the trigger signal, charging the capacitance at a controlled rate. Directly coupling the capacitance to the potential of the power supply, once the capacitance is substantially charged to the potential of the power supply.

DETAILED DESCRIPTION OF THE PREFERRED EMBODIMENTS

A preferred embodiment of the invention includes a surge suppression circuit for hot plugging a device into a system for gradually powering up the device. This surge suppression circuit permits gradual charging up of a device's relatively large capacitance without a permanently in series component, such as a physically large pass transistor. As mentioned above, a pass transistor can fail and thus disconnect the device from a system's power supply. Instead, this embodiment uses a relatively small, non-series, briefly turned on power transistor without a charge pump circuit. Moreover, this embodiment uses a single power connection to trigger charging of a device's capacitance and to actually charge the device's capacitance.

Figure 1:
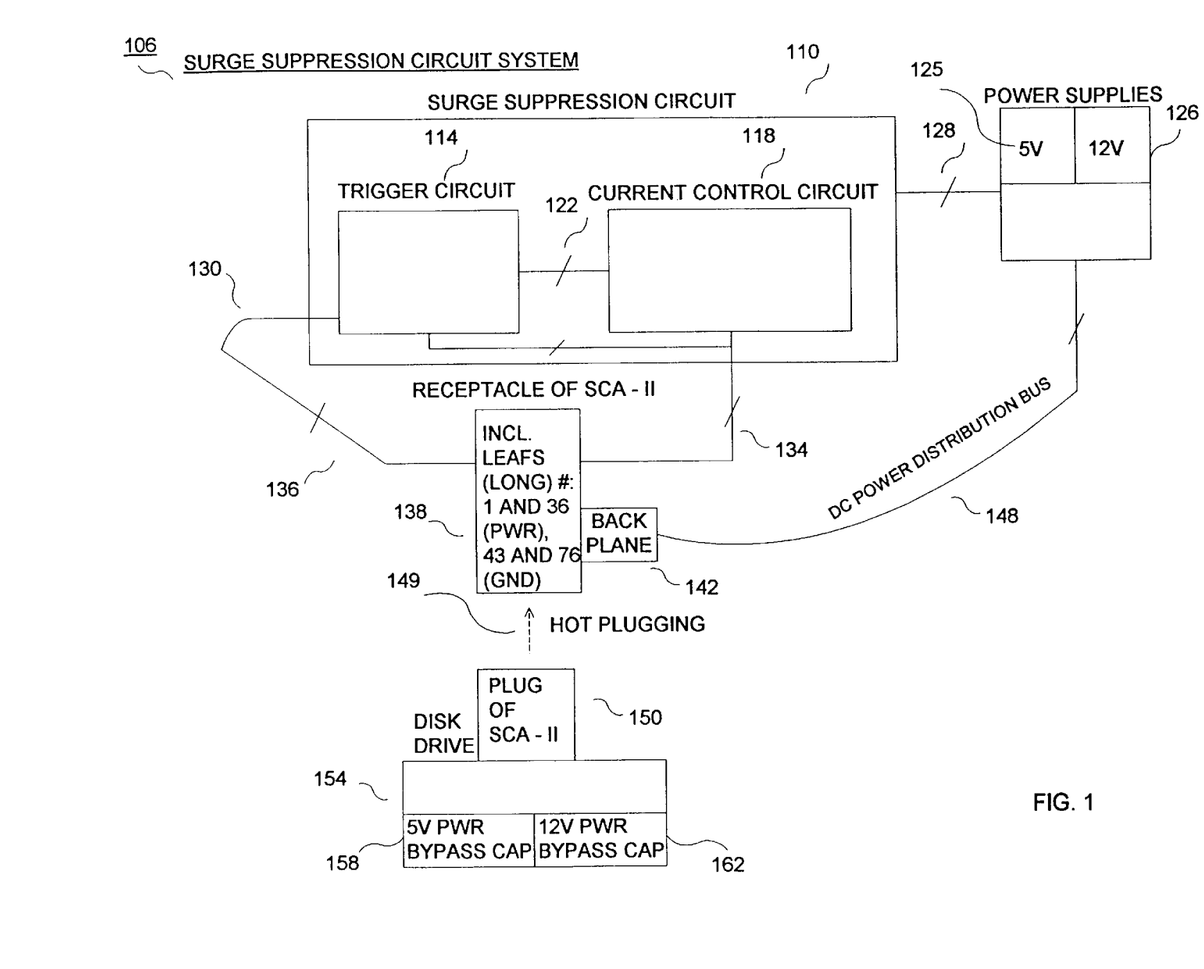
FIG. 1 is a diagram of a surge suppression circuit system, in accordance with a preferred embodiment of the invention.

FIG. 1 shows a surge suppression circuit system 106. The surge suppression circuit system 106 includes a surge suppression circuit 110. The surge suppression circuit 110 has a trigger circuit 114 and a current control circuit 118. Current control circuit 118 can be implemented as a current limiting circuit 218, 218' (see FIG. 2) and as a slew rate control circuit 318, 318' (see FIG. 3), as further discussed below. The trigger circuit 114 controls the current control circuit 118 via conductors 122 (a slash through conductors 122 and elsewhere indicates multiple wires). Power supplies 125, 126 provide DC (direct current) power to the surge suppression circuit 110 via conductors 128. The trigger circuit 114 has a port 130 that is electrically connected to a connector system, such as SCA-II (Single Connector Attachment Version II) with eighty contact leafs 138. The receptacle 138 can be soldered to a backplane 142 of, for example, a RAID system. The SCA-II connector system is typically used for connecting SCSI hard disk drives to RAID systems. SCSI stands for "Small Computer System Interface." SCSI is a hardware interface that permits connecting peripheral devices, such as disk drives, to a system. Port 130 of the trigger circuit 114 connects to leafs No. 76 and No. 43, which are long ground leafs, as further explained below. Conductors 134 of the current control circuit 118 connects to leafs No. 36 and No. 1 of the receptacle 138. Leafs No. 36 and No. 1 are long power supply leafs, as also further explained below.

The receptacle 138 has additional power supply leafs that are connected via a DC power distribution bus 148 to the power supplies 125, 126. The DC bus 148 typically also supplies power to additional circuits (not shown) of, for example, a RAID system. The connector system of the SCA-II has a second component, a plug 150. The plug may be attached to the disk drive 154 which is to be hot plugged into the receptacle 138. The disk drive 154 has power bypass capacitances 158, 162 for the 5 and 12 volt power supplies, 125, 126, respectively. Of course disk drive 154 may have additional capacitances.

Table I below shows the SCA-II pinout. Although Table I shows a pinout for the SCA-II connector that is single-ended, one of ordinary skill in the art will understand based on this description that this invention also will work for a differential version of a SCSI disk drive that may connect to the SCA-II connector system.

TABLE I

SINGLE CONNECTOR ATTACHNENT (SCA-II) SEQUENCE PATTERN AND PIN OUT*
SINGLE CONNECTOR PINOUT, SINGLE-ENDED

| Length | Contact Leaf No. | Signal Name | Signal Name | Contact Leaf No. | Length |
|---|---|---|---|---|---|
| (L) | 1 | 12 VOLT | 12 V GROUND | 41 | (L) |
| (S) | 2 | 12 VOLT | 12 V GROUND | 42 | (L) |
| (S) | 3 | 12 VOLT | 12 V GROUND | 43 | (L) |
| (S) | 4 | 12 VOLT | 12 V GROUND | 44 | (S) |
| (S) | 5 | RESERVED/NC | RESERVED/NC | 45 | (L) |
| (S) | 6 | RESERVED/NC | RESERVED/NC | 46 | (L) |
| (S) | 7 | –DB(11) | GROUND | 47 | (S) |
| (S) | 8 | –DB(10) | GROUND | 48 | (S) |
| (S) | 9 | –DB(9) | GROUND | 49 | (S) |
| (S) | 10 | –DB(8) | GROUND | 50 | (S) |
| (S) | 11 | –I/O | GROUND | 51 | (S) |
| (S) | 12 | –REQ | GROUND | 52 | (S) |
| (S) | 13 | –C/D | GROUND | 53 | (S) |
| (S) | 14 | –SEL | GROUND | 54 | (S) |
| (S) | 15 | –MSG | GROUND | 55 | (S) |
| (S) | 16 | –RST | GROUND | 56 | (S) |
| (S) | 17 | –ACK | GROUND | 57 | (S) |
| (S) | 18 | –BSY | GROUND | 58 | (S) |
| (S) | 19 | –ATN | GROUND | 59 | (S) |
| (S) | 20 | –DB(PO) | GROUND | 60 | (S) |
| (S) | 21 | –DB(7) | GROUND | 61 | (S) |
| (S) | 22 | –DB(6) | GROUND | 62 | (S) |
| (S) | 23 | –DB(5) | GROUND | 63 | (S) |
| (S) | 24 | –DB(4) | GROUND | 64 | (S) |
| (S) | 25 | –DB(3) | GROUND | 65 | (S) |
| (S) | 26 | –DB(2) | GROUND | 66 | (S) |
| (S) | 27 | –DB(1) | GROUND | 67 | (S) |
| (S) | 28 | –DB(0) | GROUND | 68 | (S) |
| (S) | 29 | –DB(P1) | GROUND | 69 | (S) |
| (S) | 30 | –DB(15) | GROUND | 70 | (S) |
| (S) | 31 | –DB(14) | GROUND | 71 | (S) |
| (S) | 32 | –DB(13) | GROUND | 72 | (S) |
| (S) | 33 | –DB(12) | GROUND | 73 | (S) |
| (S) | 34 | 5 VOLT | 5 V GROUND | 74 | (S) |
| (S) | 35 | 5 VOLT | 5 V GROUND | 75 | (L) |
| (L) | 36 | 5 VOLT | 5 V GROUND | 76 | (L) |
| (L) | 37 | SYNC | ACTIVE LED OUT | 77 | (L) |
| (L) | 38 | RMT-START | *DLYD-START | 78 | (L) |
| (L) | 39 | SCSIID(0) | SCSIID(1) | 79 | (L) |
| (L) | 40 | SCSIID(2) | SCSIID(3) | 80 | (L) |

L = Long
S = Short
* = Small form factor committee proprosal

The pinout of Table I shows contact leafs of receptacle 138 of varying lengths. For example, several ground contact leafs are long (L) as opposed to other contact leafs which are short (S). Some contact leafs labeled as ground (e.g., Nos. 75 and 41) are long, so that when an operator inserts plug 150 into receptacle 138, the long ground contact leafs are the first ones to make contact. An operator is a person that replaces disk drives 154 in a RAID system. This permits electrostatic discharge to occur prior to any short leafs of the plug 150 making contact with leafs of receptacle 138. Also, for example, the SCSI bus identification information typically needs to be valid as soon as possible. Therefore, the contact leafs for the SCSI identification information, contact leafs Nos. 39, 40, 79, and 80 are long. Some contact leafs with identical signal names differ, however, in length.

Leaf No. 76 is for connecting, to ground (zero volts) (not shown) of the 5 volt power bypass capacitance 158. Leaf No.

76 is long as indicated by the letter "L". Similarly, leaf No. 43 also is long. Leaf No. 43 is for connecting to ground (not shown) of the 12 volt power bypass capacitance 162. Leaf No. 36 also is long, but is connected via conductors 134, via the current control circuit 118, and via conductors 128 to the positive 5 volt terminal of the power supply 125. Leaf No. 1 is a long leaf as well. It connects to the 12 volt power supply 126 via conductors 134, via current control circuit 118, and via conductors 128.

As can be seen from Table I, there are additional 5 volt ground leafs Nos. 74 and 75, one of which is short, that are connected to ground (279 of FIG. 2) of the backplane 142 to which the receptacle 138 is attached. Similarly, additional 12 volt ground leafs Nos. 41, 42, and 44 are connected to ground 279.

The SCA-II connector system also has additional power supply contact leafs. For example, there are two short power supply leafs, No. 34 and No. 35. These additional 5 volt power supply leafs are connected via the DC bus 148 to the 5 volt power supply 125. Similarly, additional short 12 volt power supply contact leafs, No. 2 and No. 3 are connected via DC bus 148 to power supply 126.

However, contact leafs No. 76 and No. 43 of the receptacle 138 are not connected to ground. As further explained below, these contact leafs are grounded once the plug 150 of the disk drive 154 is hot plugged into the receptacle 138. The plug 150 has leafs of equal length for mating with the receptacle's 138 variable length contact leafs.

The surge suppression circuit system 106 functions as follows. When the plug 150 of the disk drive 154 is hot plugged (as indicated by dashed arrow 149) into receptacle 138, then the leafs of the plug 150 mate with the corresponding contact leafs of the receptacle 138. So, contact leafs No. 36 and No. 1 connect to the 5 volt power supply bypass capacitor 158 and to the 12 volt power supply bypass capacitor 162, respectively. Consequently, the power bypass capacitors 158 and 162 are coupled to the 5 volt and 12 volt power supplies 125 and 126, respectively. Although, all of the leafs in the plug 150 are of equal length, since contact leafs No. 36 and No. 1 are long while the remaining power supply contact leafs are short, contact leafs No. 36 and No. 1 will make electrical contact with the leafs of plug 150 prior to the short leafs making electrical contact with the other power supply leafs.

Typically the power bypass capacitors 158 and 162 are in partially or completely discharged states. They may be partially discharged, because, for instance, they may have had insufficient time to discharge completely after the disk drive 154 was hot plugged a first time and then hot plugged again. These states are transmitted to the trigger circuit 114 via conductors 134, as further explained below. A discharged (or partially discharged) state of a power bypass capacitor 158, 162 causes the trigger circuit 114 to trigger the current control circuit 118 via conductor 122. Having been triggered, the current control circuit 118 gradually begins to charge the power bypass capacitors 158 and 162 via conductor 134.

When an average person hot plugs a disk drive 154, a delay time of around one milli-second may elapse after the long contact leafs No. 1 and No. 36 make contact with their corresponding power leafs of the plug 150 before the remaining short power contact leafs make contact with their corresponding power supply leafs of the plug 150. This delay time allows the current control circuit 118 to gradually and sufficiently charge the power bypass capacitors 158, 162 to avoid sudden current drains when the remaining power leafs make contact with the short power supply contact leafs of receptacle 138.

Figure 2A:
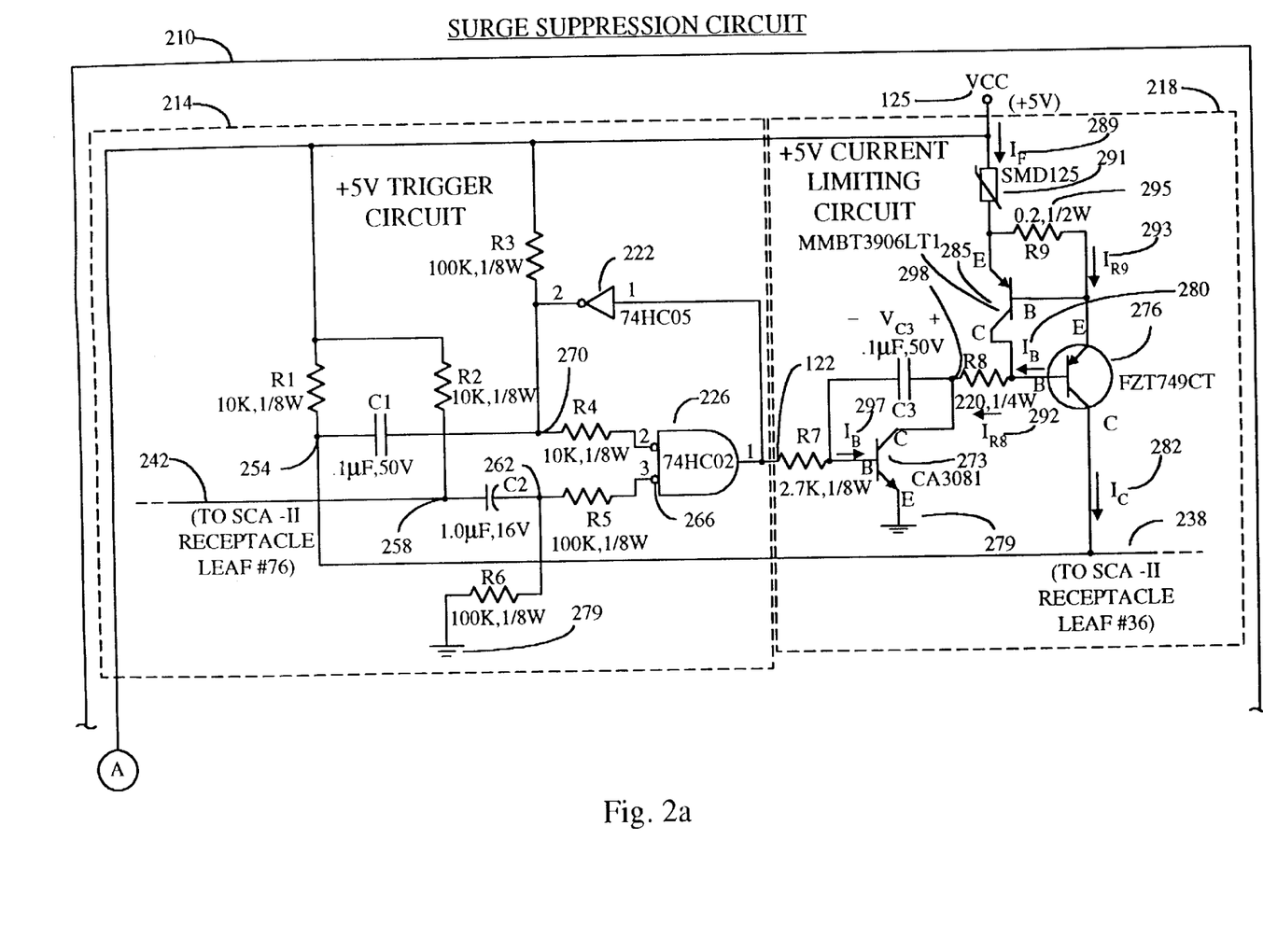
FIGS. 2a and 2b are detailed circuit diagrams of a surge suppression circuit, in accordance with a preferred embodiment of the invention.
Figure 2B:
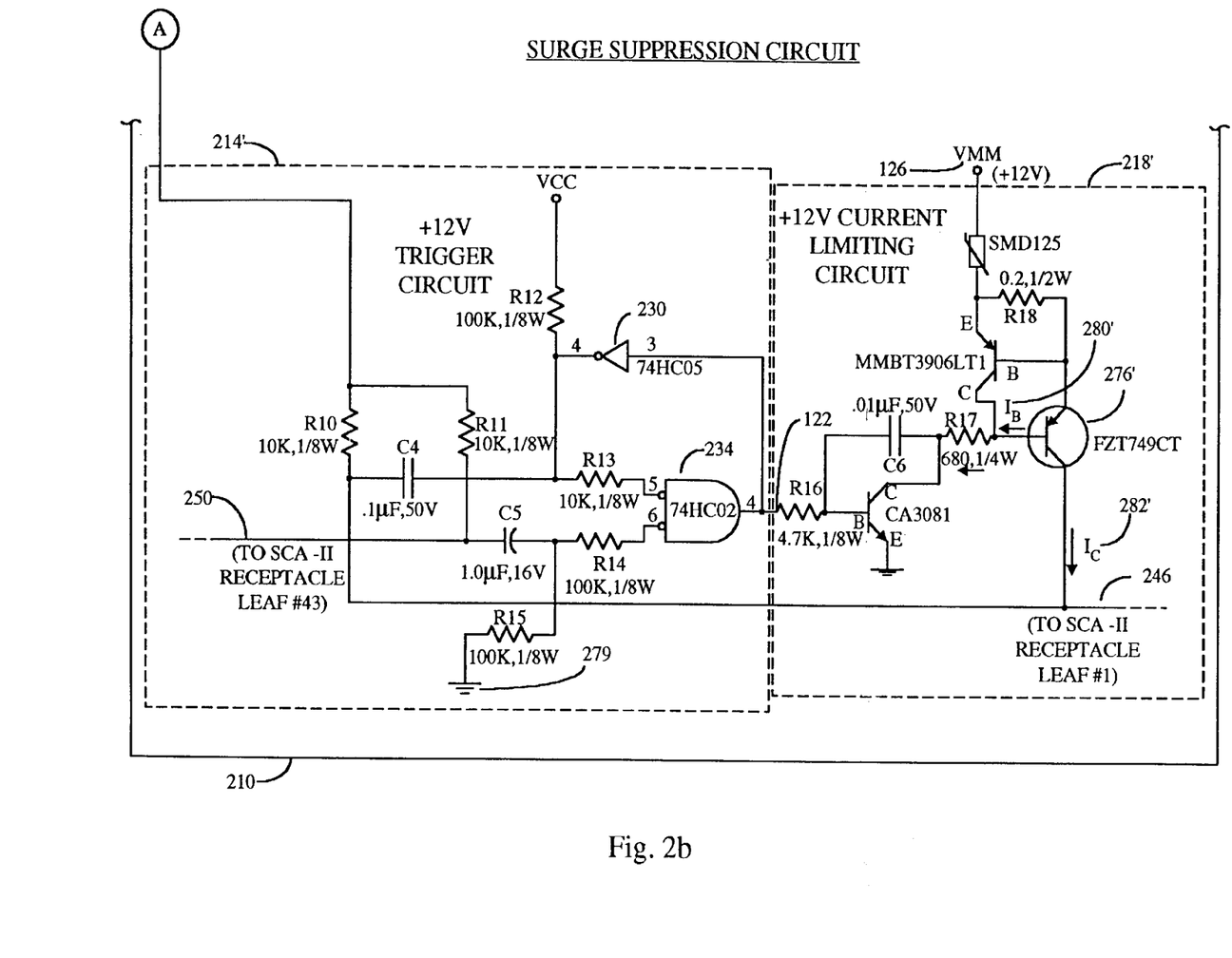
Figure 3A:
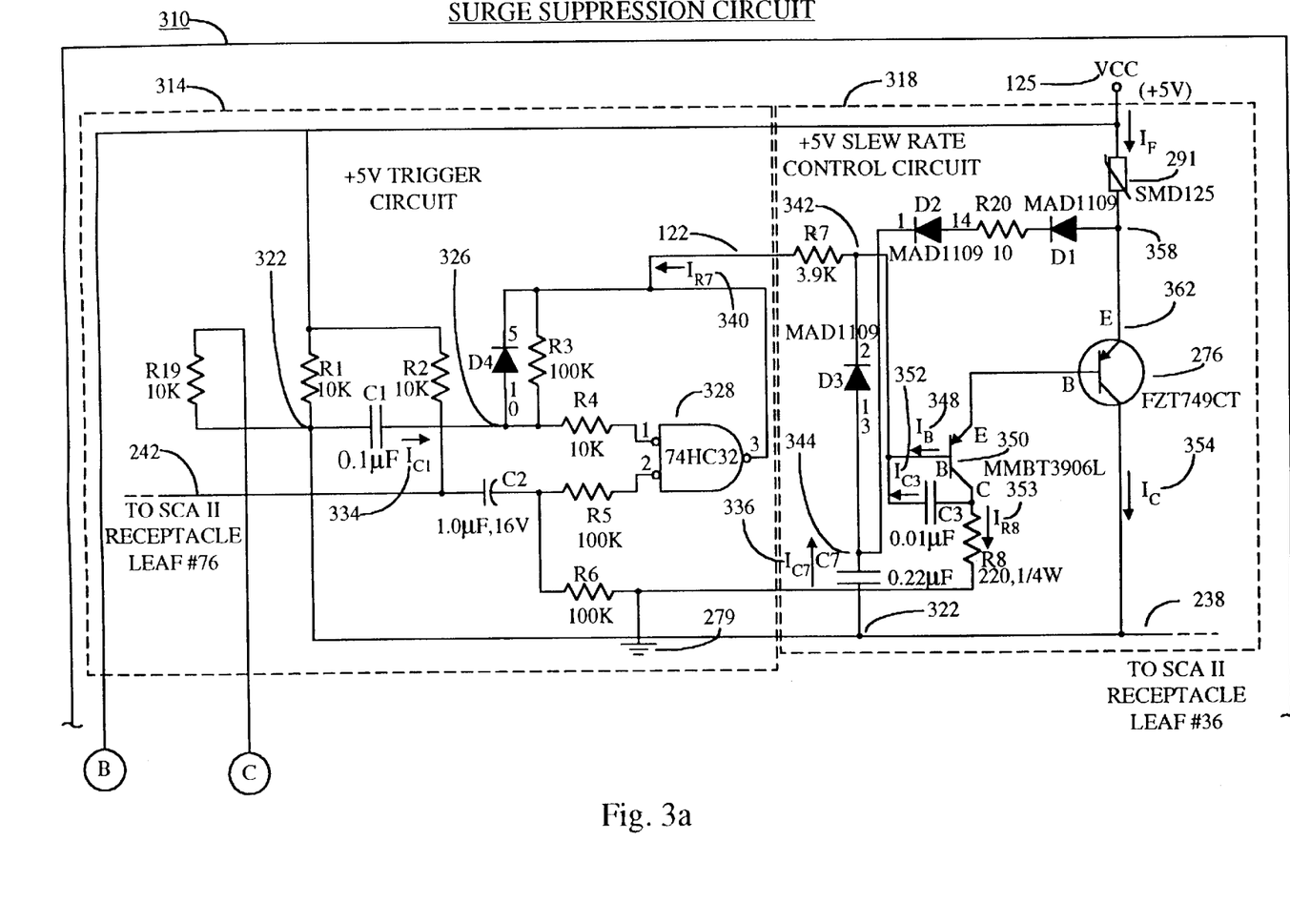
FIGS. 3a and 3b are detailed circuit diagrams of a surge suppression circuit, in accordance with a preferred embodiment of the invention.
Figure 3B:
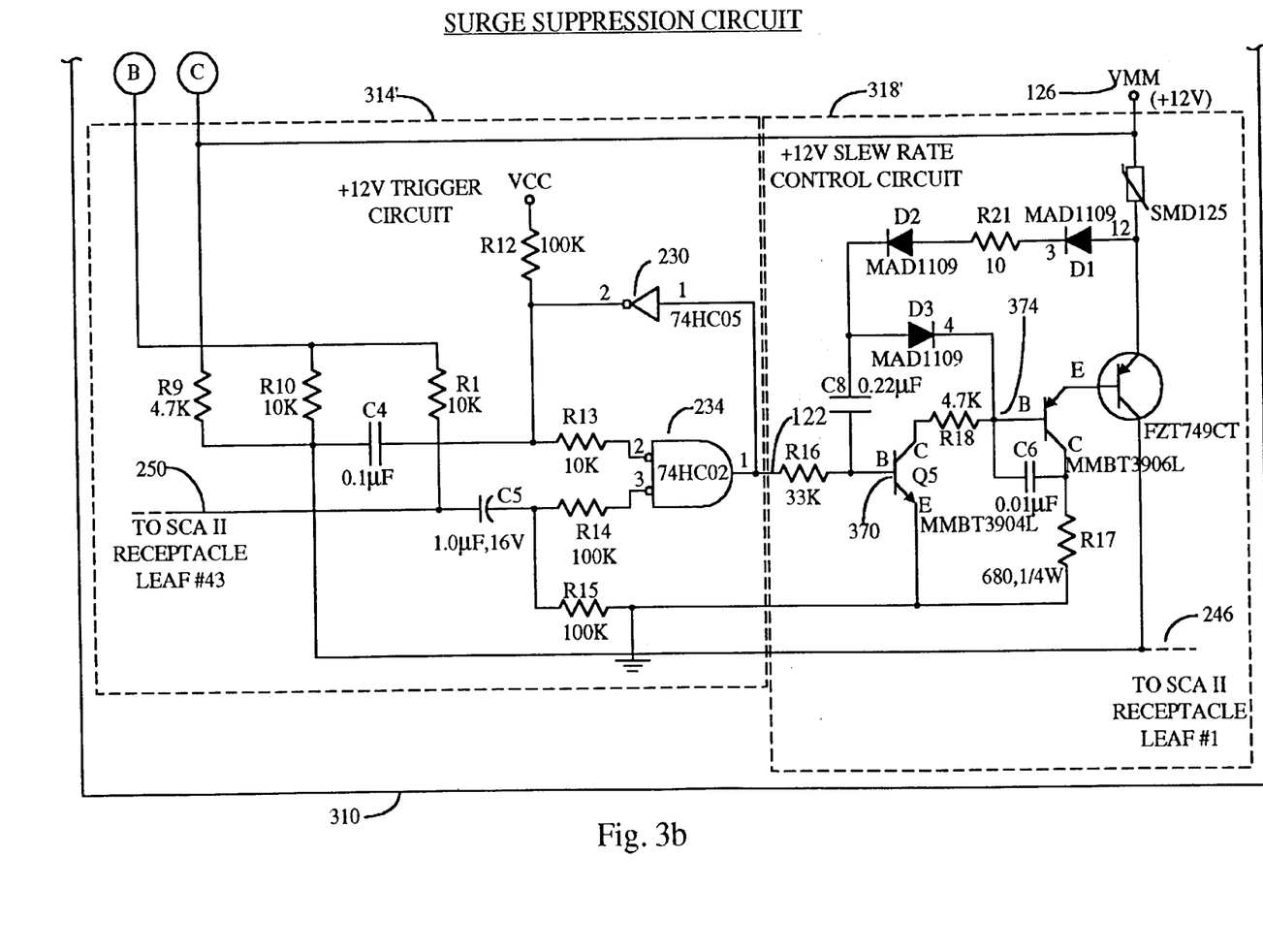

FIGS. 2a and 2b are detailed circuit diagrams of a surge suppression circuit 210. In the surge suppression circuit 210, for each power supply 125, 126 there is a corresponding trigger circuit 214 and a current limiting circuit 218. Trigger circuit 214 in FIG. 2a for the 5 volt power supply 125 preferably is identical to the trigger circuit 214' in FIG. 2b for the 12 volt power supply 126. Both trigger circuits 214 and 214' use TTL (Transistor-Transistor Logic) gates such as inverter 222, logic AND gate 226 and inverter 230, logic AND gate 234, respectively. The logic AND gates 226, 234 are CMOS (Complimentary Symmetry Metal-Oxide-Semiconductor) gates. Type numbers for the individual gates are as shown in FIG. 2.

The current limiting circuits 218 of FIG. 2a and 218' of FIG. 2b, i.e., one embodiment of current control circuit 118, differ in some of the values for their components due to a difference in operating conditions caused by the difference in the voltages between the power supply voltages of power supplies 125, 126. As shown in FIG. 2a, trigger circuit 214 is electrically connected to leaf No. 36 via surge connection 238. In addition, trigger circuit 214 is connected to the ground leaf No. 76 via connection 242. The current limiting circuit 218 also is connected to the surge connection 238. Similarly, the trigger circuit 214' has a surge connection 246 and a connection 250 through which the trigger circuit 214' is coupled to leafs No. 1 and No. 43, respectively. Current limiting circuit 218' also connects to the surge connection 246. Of course, additional trigger circuits and current limiting circuits can be added for further power supplies. Since the operation of the trigger circuit 214' and the current limiting circuit 218' is similar to the trigger circuit 214 and the current limiting circuit 218 except for the operating conditions due to the difference in the voltages of the power supplies 125, 126, only the operation of the trigger circuit 214 and the current limiting circuit 218 will be discussed here. Based on this discussion of trigger circuit 214 and the current limiting circuit 218, one of ordinary skill in the art will understand the operation of trigger circuit 214' and the current limiting circuit 218'.

Prior to plug 150 making any contact with the leafs of receptacle 138, nodes 254 and 258 are pulled up to the 5 volts of power supply 125 by their respective resistors R1 and R2. (Resistances along with rated powers are as indicated in FIG. 2.) Node 262 is pulled to ground potential 279 by resistor R6. Furthermore, since very little current is flowing in current limiting resistor R5 (due to the high input impedance of the CMOS logic AND gate 226), the voltage potential at pin 3 of the logic AND gate 226 also is at ground level 279. However, due to a high voltage (5 volts) at node 270 and due to inverter 222, pin 2 of the logic AND gate 226 is at a high voltage potential (i.e at 5 volts), as further discussed below.

Node 270 is at the same high voltage potential as node 254. That the voltage at node 270 is high becomes clear from the following discussion. Initially, prior to hot plugging disk drive 154, when the power supply 125 is turned on, current flows through resistor R2, via capacitor C2 (which is initially discharged prior to power supply 125 being turned on and therefore acts as a short), and through resistor R6. (Capacitances along with rated voltages are as indicated in FIG. 2.) Since resistor R6 is much greater than resistor R2, most of the power supply's 125 voltage drop will be across resistor R6. Therefore the voltage at node 262 will briefly be high as power supply 125 turns on and capacitor C2 charges up. A high voltage at node 262 causes a high voltage at pin 3 of the logic AND gate 226, since little current flows through the current limiting resistor R5. So, pin 1 of the logic AND gate 226 will be at a low voltage. Then inverter 222 latches this low voltage at pin 1, such that node 270 remains at a high voltage.

Resistor R3 maintains a high voltage at pin 2 of the logic AND gate 226. Resistor R3, which has only a relatively insubstantial voltage drop across it, provides the small amount of current from power supply 125 needed to pull the voltage high at pin 2 of the logic AND gate 226. Resistor R3 is used, because the inverter 222 is an open collector (or open drain) logic gate, for reasons that become clear further below.

Due to pin 1 of the logic AND gate 226 being low prior to hot plugging of disk drive 154, i.e. at 0 volts, the base terminal of NPN transistor 273 does not receive any current (through R7) from AND gate 226. The transistors in the current limiting circuit 218 are bipolar junction transistors, although other suitable types of transistors could be used also. Thus the transistor 273 is turned off, i.e., it substantially does not conduct collector current (not shown) into its base. When transistor 273 is off, then PNP power transistor 276 also will be off. The power transistor 276 can be, for example, one made by Zetex, Inc. (of New York State and of England) part No. FZT749CT.

Once an operator begins hot plugging disk drive 154, receptacle's 138 long leafs Nos. 36 and 76 are amongst the first electrical connections made with the traveling disk drive's plug 150, respectively connecting nodes 254 and 258 to the power bypass capacitor 158 (its high and low voltage potential terminals). Due to the fact that initially the power bypass capacitor 158 is substantially discharged, node 254 is pulled low, i.e., to ground 279. There is no differential charge distributed across capacitor C1, because, as explained above, nodes 254 and 270 are at the same voltage potential before the disk drive 154 is hot plugged. So, as node 254 is pulled low by plug's 150 leaf No. 36 (36r mating with contact leaf No. 36), capacitor C1 initially acts as a short circuit, pulling down node 270, since inverter 222 is an open collector (or open drain) gate, as further discussed below. As logic AND gate's 226 pin 3 has been held low by R6, the logic AND gate 226 will output a high on its pin 1. Consequently, inverter 222 will output a low on its output pin 2, thereby disallowing current flow through capacitor C1 or resistor R3 to raise the voltage at node 270. Inverter 222 is provided as a latching mechanism to maintain gate 226 active, outputting a high voltage on its pin 1 output after the disk drive 154 has been inserted. Inverter 222 is chosen to be an open-drain (or open-collector) device, so as to be unable to source current and thus destroy the coupling effect of capacitor C1. Capacitor C1 would be unable to pull down node 270 with a sourcing capable gate present.

Although the connection 242 also is pulled low, charge on capacitor C2 accumulated during the pre-hot plug time causes node 262 to change from 0 volts to negative 5 volts. Therefore, pin 3 voltage of the logic AND gate 226 remains low. Current limiting resistor R5 limits current flowing out of pin 3 of the logic AND gate 226. Thus, pin 1 of the logic AND gate can go high, thereby turning on transistor 273.

However, transistor 273 will turn on slowly due to the presence of capacitor C3 and resistor R7, as further explained below. Turning on transistor 273 results in base current 280 of power transistor 276 increasing only slowly. It follows, that power transistor 276 turns on gradually, i.e, its collector current 282 increases gradually. Consequently, the 5 volt power bypass capacitance 158 connected to plug 150's pin No. 36 (for mating with contact leaf No. 36) is charged up gradually. Such gradual charging up of the power bypass capacitance 158 minimizes disturbances of the 5 volt level in the DC bus 148 and thereby to any other circuits electrically connected to DC bus 148.

Prior to an operator starting to hot plug disk drive 154, PNP transistor 285 (for example, Motorola, Inc. of Illinois, part No. MMBT3906LT1) is not on, i.e., its collector current 287 is approximately zero. However, once power transistor 276 is turned on, a fuse current 289 begins to flow through fuse 291 and on through current sensing resistor R9. The fuse 291 can be a Poly Switch fuse. Poly Switch is claimed to be a trademark of Raychem Corp. of Menlo Park, Calif. Fuse 291 protects the current limiting circuit 218 against excessively high continuous current from power supply 125, such as due to disk drive 154 never having achieved full seating. As collector current 282 gradually increases, a voltage drop across resistor R9 also gradually increases until it reaches a level of approximately 0.7 volts. At 0.7 volts, the emitter-base junction voltage between the emitter E and base B of transistor 285 is sufficiently high for transistor 285 to begin to conduct.

Once transistor 285 is conducting, it decreases the amount of base current 280 from transistor 276 (that would be available with transistor 285 being off), as a significant portion of R8's current 292 is made up of transistor's 285 collector current 287, instead of being singly composed of transistor's 276 base current 280. Current 293 through resistor R9 will hold steady at a value determined by the ratio of transistor's 285 emitter-base voltage to the resistance value of resistor R9. So, in the current limiting circuit 218, resistor current 293 will be limited at a value of about 3.5 amperes, due to the particular values of the resistance of resistor R9. Once the current sensing resistor R9 limits the current 293 to 3.5 amperes, the 5 volt power bypass capacitance 158 will be charged at that current, because resistor current 293 substantially equals collector current 282.

As the 5 volt power bypass capacitance 158 is charged up, the voltage 295 across resistor R9 eventually is reduced below the minimum value required to keep transistor 285 conducting (about 0.7 volts for silicon transistors). At that point, power transistor 276 turns on hard (achieves full saturation), as then resistor current 292 is made up of transistor's 276 base current 280. Thereafter, power transistor 276 charges the 5 volt power bypass capacitance 158 to about 5 volts less a saturation voltage of power transistor 276, less a voltage drop 293 across resistor R9, and less the small voltage drop across fuse 291.

Component values in the surge suppression circuits 110, 210, 310 (see FIG. 3) are selected to keep voltage drops in the power supply voltages to values that avoid disturbances to any other circuits powered from such supply voltages. At the same time, such component values are selected so as to be able to carry the disk drive's 154 current requirements (once the disk drive 154 actually beings operating) until the drive is fully seated. To illustrate, prior to being fully seated but after it begins operating, a standard disk drive can draw 1 ampere at 5 volts and at 12 volts. A standard disk drive can cause a surge current of up to 6 amperes.

As mentioned above, in the surge suppression circuit 210, the current sensing resistor R9 limits the fuse current 289 to about 3.5 amperes. Some power supplies 125 can supply 16 amperes of current. Three and half amperes is about 22 percent of the capacity of such a 5 volt power supply 125. Such utilization of power supply's 125 capacity does not result in an appreciable voltage drop in power supply's 125 voltage. Indeed, some power supplies can handle supplying between 20 and 50 percent of their rated current without a significant drop in their rated voltages. Of course, for less capable power supplies, for example, a larger resistance of resistor R9 may have to be selected. A larger resistance of resistor R9 obviously would decrease the magnitude of fuse current 289. However, without the fuse current 289 being limited to, for instance, 3.5 amperes, a 5 volt power supply could supply, for example, a current of roughly 16 amperes for 5 micro-seconds, but with a resulting sudden voltage drop from 5 volts to roughly 4 volts. Similarly, a 12 volt power supply could supply, for example, 40 amperes of current for about 5 micro-seconds, but with a resulting sudden voltage drop from 12 volts to less than 10 volts.

Such selection of component values in the surge suppression circuits 110, 210, 310 allows these circuits 110, 210, 310 to gradually and sufficiently charge the power bypass capacitors 158, 162, while avoiding sudden increases in power requirements, as discussed above, when the power leafs of plug 150 make contact with the short (S) power supply contact leafs of receptacle 138. In the surge suppression circuit 210, the time constant of the resistor R7 and the capacitor C3 as well as the size of the current through resistor R9 are selected, such that a typical 5 volt power bypass capacitance 158 is almost fully charged to the 5 volt level (less the voltages mentioned immediately above) before the remaining 5 volt power supply leafs of plug 150 make contact with the short 5 volt contact leafs of the receptacle 138, i.e., about one milli-second. Through these short 5 volt contact leafs (No. 34 and No. 35), the 5 volt power bypass capacitance 158 will be charged to the full 5 volts of the power supply 125.

In determining values of the components of the current limiting circuit 218, the value of, for instance, the resistance of resistor R8 can be computed as follows. The voltage drop across resistor R8 divided by a desired magnitude of base current 280 yields a preferred value for the resistance of resistor R8. The desired base current can be computed by dividing the desired collector current 282 (3.5 amperes) by the beta (i.e., the current gain of a bipolar junction transistor) of power transistor 276. The voltage drop across resistor R8 equals the 5 volts of power supply 125 less the voltage drop (about 0.1 volts) across fuse 291, the voltage drop (about 0.7 volts) of the emitter base junction of transistor 285, the emitter base voltage drop (about 0.7 volts) of power transistor 276, and less the saturation voltage (about 0.2 volts) across the collector C and emitter E terminals of transistor 273.

Resistance R7 is derived from the voltage drop across resistor R7 divided by the base current 297 into pin 16 of transistor 273. The magnitude of the base current 297 follows from the ratio of the resistor current 292 through R8 divided by the beta of the transistor 273. The voltage drop across resistor R7 equals the voltage at pin 1 (about 5 volts) of the logic AND gate 226 less the voltage drop (about 0.7 volts) across the base B emitter E terminals of transistor 273.

The following considerations lead to a value of the capacitance of capacitor C3. As mentioned above, capacitor C3's purpose is to make possible the gradual turning on of power transistor 276. Capacitor C3 achieves this by initially, when the voltage at pin 1 of the logic AND gate 226 goes high, diverting current from the base B of transistor 273. This current through capacitor C3 is known as the Miller current. The rate at which the capacitor C3 diverts current from resistor R7 is determined by the rate of voltage change with time (dV/dt) across C3 multiplied by the value of the capacitance of C3. Due to the voltage at pin 1 of the logic AND gate 226 going high, the voltage $V_{C3}$ across capacitor C3 reverses from a drop (of polarity as shown in FIG. 2) of about 4.3 volts prior to current limiting circuit 218 having been triggered, to a voltage of about 0.5 volts after current limiting circuit 218 has been triggered by trigger circuit 214.

The 4.3 volts drop can be computed as follows. Prior to the voltage at pin 1 of the logic AND gate 226 going high, node 298 is at a voltage level of about 4.3 volts. This voltage is a result of voltage drops from the 5 volt level of the 5 volt power supply 125 less the 0.7 voltage drop across the emitter-base junction of power transistor 276, neglecting the voltage drop across fuse 291. Since the voltage at pin 1 of the logic AND gate 226 is close to ground 279, the voltage drop $V_{C3}$ equals approximately 4.3 volts. The 0.5 volt drop is computed by subtracting transistor's 273 saturation voltage of about 0.2 volts from the 0.7 volts across the base emitter junction of transistor 273.

As a result of having to change magnitudes and polarities of voltages (4.3 volts–(–0.5 volts)), capacitor C3 delays and diverts current from the base terminal B of transistor 273. Immediately after pin 1 of the logic AND gate 226 goes high, capacitor C3 delays turning on of transistor 276 until capacitor C3 has changed its voltage $V_{C3}$ from 4.3 volts to 3.6 volts. Only at about that point is there a sufficient base-collector voltage drop (of about 0.7 volts) to turn on transistor 276. Thereafter, a feedback system that includes resistor R7, capacitor C3, and transistor 273 gradually turns on transistor 276. In this feedback system, the capacitor C3 is the feedback element.

The following illustrates how the value of the capacitance of C3 is computed. For example, a preferred time rate of change for the voltage (dV/dt) is 4.1 volts (4.8–0.7) in 270 micro-seconds. From this rate of change divided into the magnitude of the base current 297 (current 292 divided by the beta of transistor 273), the value of the capacitance of capacitor C3 is computed. The rate at which the voltage across capacitor C3 changes drives the rate at which the base current 297 into pin 16 of transistor 273 increases.

Once the plug 150 is fully seated in the receptacle 138 and the power bypass capacitor 158 is fully charged, power transistor 276 remains on, but ceases to conduct significant collector current 282. This follows from the fact that once plug 150 is fully seated, the voltage at the surge connection 238 from power supply 125 is 5 volts (since short leafs Nos. 34 and 35 pull high surge connection 238). But the voltage at node 298 remains at about 0.2 volts, i.e. the saturation voltage of transistor 273. So, power transistor 276 can be small and consequently inexpensive. Moreover, even if resistor R1 should fail resulting in an open circuit in place of R1, and if power transistor 276 also should fail resulting in an open circuit, disk drive 154 still will have the 5 volts from power supply 155 available to it through the short 5 volt contact leafs (Nos. 34 and 35). As mentioned above, this is in marked contrast to the prior art, where, if the series pass transistor fails, disk drive 154 is disconnected from the 5 volt power supply 125.

In case disk drive 154 fails and has to be removed, receptacle's 138 leaf No. 76 will become disconnected again, as it was prior to disk drive 154 being hot plugged. Disconnecting leaf No. 76 causes the trigger circuit 214 to shut off the current limiting circuit 218, as further explained immediately below.

While the plug 150 of the disk drive 154 was seated in the receptacle 138, the voltage across capacitor C2 was zero. The zero voltage across capacitor C2 was the result of receptacle's 138 leaf No. 76 being grounded and node 262 being grounded via resistor R6. When leaf No. 76 disconnects, as disk drive 154 is unplugged from receptacle 138, power supply 125 begins charging capacitor C2 through resistor R2. However, initially when capacitor C2 begins charging, the voltage drop across C2 equals zero. But there is a voltage drop across resistor R6 through which current via C2 flows to ground 279. The voltage at node 262 immediately will jump to a high voltage level, since most of the voltage drop due to the 5 volts of power supply 125 will be across resistor R6. This follows from the fact that R6 has a ten times greater resistance than resistor R2.

Current limiting resistor R5 simply limits any current that might flow out of pin 3 of the logic AND gate 226, such as when an operator begins hot plugging disk drive 154, thereby causing capacitor C2 to pull down node 262 to negative 5 volts. Resistor R5 serves as protection from excessive current beyond two internal clamping diodes (not shown) connected at pin 3 of the logic AND gate 226. As is known in the art, these clamping diodes clamp the input to the logic AND gate 226 associated with pin 3 to one diode drop above the power supply voltage 125 and one diode drop below ground 279. Similarly, pin 2 of the logic AND gate 226 is clamped by another pair of clamping diodes to one diode drop above the power supply voltage 125 and one diode drop below ground 279.

When the voltage at node 262 briefly jumps to a high level while capacitor C2 is charging, the voltage at pin 3 of the logic AND gate 226 goes high causing the voltage at pin 1 of the logic AND gate 226 to go low and be latched low, as pin 2 of inverter 222 now outputs an open-circuit, thus allowing resistor R3 to pull high node 270 to the 5 volt level of power supply 125. This low voltage at pin 1 causes the base emitter junction of transistor 273 to cease being forward based. Such a lack of forward bias substantially prevents flow of collector current (not shown) of transistor 273. Consequently, transistors 273 and 276 effectively become open switches, thereby halting the flow of collector current 282 to surge connection 238.

The inverter 222 latches the pin 1 voltage of the logic AND gate 226 by inverting the low voltage at pin 1 of the logic AND gate 226 and converting it into a high voltage at pin 2 of the inverter 222. Pin 2 of the inverter is coupled via resistor R4 to pin 2 of the logic AND gate 226. Virtually no current flows in resistor R4 due to the high input impedance of the CMOS logic AND gate 226. Consequently, the voltage at pin 2 of the inverter 222 substantially appears at pin 2 of the logic AND gate 226. This latching action by the inverter 222 latches the current limiting circuit 218 in its reset state. The current limiting circuit 218 was in its rest state before the disk drive 154 was hot plugged into the receptacle 138. Having been reset, the trigger circuit 214 and the current limiting circuit 218 are ready for charging the capacitance 158 of another hot plugged disk drive 154.

Even if during unplugging of disk drive 154, an operator accidentally has the surge connection 238 briefly make contact through leaf No. 36 with the 5 volt leaf of plug 150, resetting by the trigger circuit 214 will continue. This resetting continues, because the time constant of the combination of C2 and R6 is significantly longer than that of the combination of C1 and R3.

As mentioned above, current limiting circuits 218 and 218' are similar except that the current limiting circuit 218' for the power supply 126 has capacitances and resistors selected for the difference in operating conditions due to having a 12 volt as opposed to a 5 volt power supply. To illustrate, the power transistor 276' has a beta value of 100 or greater. Consequently, as above, to be able to obtain a collector current 282', e.g. 3.5 amperes, the base current 282' is preferably set to at least 3.5 milliamperes by selecting the resistances of R16 and R17 accordingly. Capacitance of C6 is adjusted similarly as in current limiting circuit 218.

FIG. 3 is a circuit diagram of a surge suppression circuit 310 in another embodiment of the invention. One of ordinary skill in the art will understand based on the entire description of all of the preferred embodiments of this invention that the surge suppression circuit 310 is similar in several respects to the surge suppression circuit 210 of FIG. 2. So, the description of surge suppression circuit 310 is less detailed than that of surge suppression circuit 210.

Surge suppression circuit 310 has (as does surge suppression circuit 210) individual trigger circuits 314, 314' one each for the 5 and 12 volt power supplies 125, 126. However, instead of current limiting circuits 218, 218' the surge suppression circuit 310 has slew rate control circuits 318, 318' for power supplies 125, 126, respectively. Again, since the portions of the surge suppression circuit 310 for the 5 volt and the 12 volt power supplies 125, 126 are largely identical, this description will mostly be confined to the portion (circuits 314 and 318) of the surge suppression circuit 310 dedicated to the 5 volt power supply 125.

Before an operator begins hot plugging disk drive 154, the voltage at node 322 equals 8.5 volts with respect to ground 279. This voltage at node 322 follows from the voltage divider circuit comprising power supply 126 through resistor R19, through resistor R1 to the 5 volt power supply 125. A voltage at node 326 is 5 volts due to the latching action of pin 3 of the logic AND gate 328. (The combination of diode D4 and resistor R3 performs a function similar to that performed by the combination of resistor R3 and inverter 222 in the circuit of FIG. 2.) Thus, there is a voltage difference of 3.5 volts between nodes 322 and 326. The voltage of greater than 5 volts at node 322 permits the trigger circuit 314 to easily trigger the slew rate control circuit 318 even for a power bypass capacitance 158 that is only partially discharged.

Upon an operator inserting the plug 150 of the drive 154 into the receptacle 138, the voltage at node 322 drops to zero, i.e. ground 279 or to above zero for a partially discharged power bypass capacitance 158. The following illustrates how the trigger circuit 314 triggers the slew rate control circuit 318 for a partially discharged power bypass capacitor 158. One of ordinary skill in the art will understand based on this description how a completely discharged power bypass capacitor 158 results in triggering the slew rate control circuit 318. A power bypass capacitance 158 may already be charged to, for example, 2 volts. (A resistor R19 can be added to the trigger circuit 214 to provide the capability of triggering the current limiting circuit 218 with a partially discharged power bypass capacitance 158). Consequently, once the operator begins hot plugging disk drive 154, node 322 is pulled to 2 volts. However, capacitor C1 cannot instantaneously change its charge distribution. So, a voltage across capacitor C1 will initially remain at the 3.5 volt difference between nodes 322 and 326. Since now node 322 is at 3.5 volts, this forces node 326 to drop to negative 1.5 volts, since node 326 originally was at 5 volts.

The current limiting resistor R4 limits current flow out of pin 1 due to the negative voltage at node 326. So, the voltage at pin 1 of the logic AND gate drops to a sufficiently low value allowing pin 3 of the logic AND gate 328 to go low, thereby latching 0 volts (not −1.5 volts) at node 326. A capacitor current 334 begins to flow via capacitor C1 to adjust the charge distribution on capacitor C1 to the new voltage at nodes 322 and 326. The capacitor current 334 is being sunk into pin 3 of the logic AND gate 328. A low voltage on pin 3 triggers the slew rate control circuit 318.

Having been triggered, the slew rate control circuit 318 begins charging the power bypass capacitance 158 at a constant rate determined by the values of the capacitance of capacitor C7 and of the resistance of resistor R7, as further explained below. Values should preferably be selected for a slew rate sufficient to charge the bypass capacitor 158 at a rate that reduces drops in the power supply 125 voltage, when hot plugging disk drive 154, as discussed above. So, for slew rate control circuit 318, a preferred slew rate is 5 volts in 1 milli-second. As mentioned above, an operator's hot plugging of disk drive 154 (using, for instance, a cam actuated tray made by CORE Engineering, Inc./AIWA Co.) results in a minimum (if the operator hot plugs quite fast, not average) delay of about 1 milli-second before the leafs of plug 150 make contact with short (S) contact leafs, once other leafs of plug 150 have made contact with long (L) contact leafs of receptacle 138. Upon the 5 volt power leaf of plug 150 making contact with the long 5 volt contact leaf No. 36, capacitor current 336 begins flowing into an anode (pin 13) of diode D3. Due to the orientation of anodes and cathodes of diodes D1 and D2, the capacitor current 336 flows through resistor R7 contributing to resistor current 340. The diodes D1-4 (Part No. MAD1109) are preferably of the type manufactured by Motorola, Inc.

Capacitor current 336 begins to flow through capacitor C7, because capacitor C7 has to adjust its charge distribution due to node 322 dropping from 8.5 volts to zero volts. (This discussion is for the case of a completely discharged power bypass capacitor 158. But one of ordinary skill in the art will understand based on this description the function of the slew rate control circuit 318 for a partially discharged power bypass capacitor 158). A voltage at node 342 is about 3.6 volts due to the voltage drop between emitter base junctions of transistors 276 and 350. As a result of capacitor current 336 flowing through capacitor C7, base current 348 of transistor 350 will increase from zero to a constant rate, as determined by capacitor C7 and resistor R7.

Capacitor C7 charges through diodes D1 and D2 and resistor R20. Resistor R20 simply limits the current 336 through capacitor C7 to minimize disruptions to the voltages of the DC power distribution bus 148.

The function of the current limiting resistor R20 can be understood in greater detail from the following. Immediately after the surge connection 238 is pulled to ground by a discharged power bypass capacitor 158, capacitor current 336 begins flowing to adjust the charge distribution of capacitor C7 to a change in voltages at nodes 344 and 322, as further explained below. Before an operator began hot plugging disk drive 154, the voltage at node 344 was 5 volts, since no current was flowing in the slew rate control circuit 318. Without current flow, there is no voltage drop across, for instance, diodes D1, D2, and D3. Also, prior to hot plugging of disk drive 154, the voltage at node 322 was at 8.5 volts as mentioned previously.

Immediately upon surge connection 238 being pulled to ground, node 322 also is pulled to ground. Since capacitor C7 cannot change its charge distribution instantaneously, the node at 344 also drops by an 8.5 volts to a negative 3.5 volts. Therefore, at that time, capacitor C7 acts as a 3.5 volt power supply, while capacitor current 336 begins flowing (opposite to the direction indicated in FIG. 3) to adjust capacitor C7's charge distribution. Consequently, there is at that time approximately a 7.1 volt drop across resistor R20 (power supply voltage 125 plus the voltage across capacitor C7 less the voltage drops across diodes D1 and D2). Once the charge distribution on capacitor C7 has gone through the initial adjustment, capacitor current 336 begins flowing in the direction shown in FIG. 3, as further discussed below.

Base current 348 increases gradually from zero due to the presence of capacitor C3. Capacitor C3 of FIG. 3 functions similarly to capacitor C3 in the current limiting circuit 218 of FIG. 2. Once transistor 350 has turned on, capacitor current 352 will begin flowing via capacitor C3. Capacitor current 352 begins flowing, because there is a change in voltage at node 342. Prior to hot plugging disk drive 154, the voltage at node 342 was at about 5 volts. Once an operator has begun hot plugging disk drive 154, the voltage at node 342 drops to about 3.6 volts, as mentioned above. Prior to hot plugging the disk drive 154, the collector of transistor 350 is at ground 279. Once hot plugging begins, initially there is relatively little current flow 353 through resistor R8, because transistor 350 turns on slowly. Consequently, the voltage at the collector of transistor 350 initially remains close to ground 279. Since charge distribution across capacitor C3 cannot change instantaneously, capacitor current 352 begins flowing to adjust the charge distribution across capacitor C3 to the drop in voltage at node 342 and the voltage at the collector remaining relatively unchanged. Since the resistor current 340 through resistor R7 is fixed by the ratio of the voltage at node 342 divided by the resistance of R7, current 352 via capacitor C3 reduces the base current 348 that can flow out of the base of transistor 350. So, capacitor C3's adjusting of its charge distribution delays an increase in the base current 348 of transistor 350, thereby slowing down an increase in collector current 354 of transistor 276.

Transistors 350 and 276 are in a semi-Darlington configuration. The difference between that configuration and the standard Darlington configuration is that the collectors of transistors 350 and 276 are not directly connected. This reduces the typical Darlington configuration voltage drop of about 0.9 volts between the emitter 362 of transistor 276 and the collector of transistor 350, without significantly sacrificing amplification by the transistor combination 350 and 276 of collector current 354. The combination of transistors 276 and 350 has only a 0.2 volts voltage drop between node 358 and the surge connection 238, i.e., the saturation voltage of transistor 276.

To insure that base current 348 is not diverted from transistor 350, the slew rate control circuit 318 includes three diode voltage drops (2.1 volts total) of diodes D1, D2, and D3. The total voltage drop between emitter 362 and base of transistor 350 is only 1.4 volts. Since 1.4 volts is less than the 2.1 volts of voltage drop through diodes D1, D2, and D3, these three diodes will not prevent base current 348 from flowing. The presence of D3 prevents transistors 276 and 350 from turning on hard when surge connection 238 is grounded. Turning on hard of transistors 276 and 350 would occur due to C7 charging emitter base junctions of transistors 276 and 350 immediately upon surge connection 238 being grounded due to hot plugging of disk drive 154. As explained above, initially, when disk drive 154 is hot plugged, current IC7 through capacitor C7 is reversed from the direction shown in FIG. 3a.

In another embodiment, the slew rate control circuit 318 includes only a single diode, either D1 or D2, between nodes 358 and 344. This embodiment would still include D3. However, to preclude the possibility that D1 (or D2) and D3 do not prevent transistors 276 and 350 from turning on, the voltage drops of emitter base junctions of transistors 276 and 350 should be less than the voltage drops across D1 (or D2) and D3. Low emitter-base voltage drops might be achieved by using Germanium transistors for transistors 276 and 350. Germanium transistors typically have a voltage drop of only about 0.2 volts across their emitter-base junctions. Voltage drops of diodes D1 and D3 are significantly greater than such emitter base voltage drops.

The slew rate at which the slew rate control circuit 318 charges the power bypass capacitor 158 is determined from the capacitor current 336 and from the resistor current 340. The capacitor current 336 through capacitor C7 is defined by the following equation. The capacitor current 336 equals the capacitance of capacitor C7 multiplied by the rate of change with time of the voltage at surge connection 238, as shown in Equation 1 below.

$$I \text{ via } C7 = C7 \times dV \text{ surge connection}/dt \quad (1)$$

Since pin 3 of the logic AND gate 328 is low, the current 340 through resistor R7 equals the voltage at node 342 (about 5 volts of the power supply 125 less the voltage drop between emitter 362 and base of transistor 350) divided by the value of the resistance of resistor R7. The current 340 is a combination of the capacitor current 336 through capacitor C7 and the base current 348 of transistor 350. However, the base current 348 can be neglected, because it is relatively small. The base current 348 equals the collector current 354 divided by the product of the betas of transistors 276 and 350. Consequently, there is a simplified equation for the rate of change with time of the voltage at surge connection 238, i.e., the slew rate. This rate of change equals the voltage at node 342 divided by the product of the resistance of resistor R7 and the capacitance of capacitor C7, as shown below in Equation 2.

$$\text{slew rate} = dV \text{ surge connection}/dt \approx V \text{ at } 342/(R7 \times C7) \quad (2)$$

In equation 2, the current through capacitor C3 has been neglected, since the capacitance of C3 is much less than the capacitance of C7. But C3 serves as a compensating capacitor that reduces the current gain of transistors 276 and 350 at high frequencies, thereby minimizing feedback loop instabilities. The slew rate feedback loop includes capacitor C7 and resistor R7.

The operation of capacitor C7 and resistor R7 can be understood as follows. As explained above, the current 340 through resistor R7 is fixed by the voltage at node 342 divided by the resistance of R7. But the components of resistor current 340 (capacitor current 336 and base current 348) can vary. When the rate of change with time of the voltage at surge connection 238 increases beyond that set by Equation 2, then capacitor current 336 also increases, as specified by Equation 1. But since the resistor current 340 is fixed in magnitude, the base current 348 decreases to accommodate the increase in the capacitor current 336. A decrease in the base current 348 causes a decrease in the collector current 354. Therefore, the rate of change of the voltage at surge connection 238 also decreases. Similarly, resistor R7 and capacitor C7 cooperate to increase the rate of change with time of the voltage at surge connection 238, when that voltage drops below the value specified by Equation 2.

The following briefly illustrates the similarities and differences between the 5 volt portion 314, 318 and the 12 volt portion 314', 318' of surge suppression circuit 310. The trigger circuit 314' is similar to trigger circuit 314, except that trigger circuit 314' uses an inverter 230, as did trigger circuits 214, 214' of FIG. 2. (The 5 volt trigger circuit 314 simply uses a logic AND gate 328, instead of a separate inverter to latch the voltage at pin 3 to pin 1 of the logic AND gate 328.)

The function of the slew rate control circuit 318' is similar to that of the slew rate control circuit 318, except that a buffer transistor 370 has been added to buffer pin 1 of the TTL logic AND gate 234 from the 12 volts of power supply 126, because a voltage at pin 1 of significantly greater than 5 volts can damage the TTL logic AND gate 234.

In the slew rate control circuit 318' transistor 370 permits resistor R18 and capacitor C8 to function similarly to resistor R7 capacitor C7 of the slew rate control circuit 318. Transistor 370 acts like an inverter, similar to the inverter incorporated into the logic AND gate 328 at pin 3. Transistor 370 inverts a high voltage at pin 1 of the logical AND gate 234. In this fashion, the voltage at the collector of transistor 370 goes low. As stated above, when an operator begins hot plugging disk drive 154, the surge connection 246 makes electrical contact with the 12 volt power bypass capacitor 162. Then the slew rate control circuit 318' provides a substantially constant rate of change with time of the voltage at the surge connection 246. In the slew rate control circuit 318', this rate of change with time of the voltage equals approximately the voltage at node 374 divided by the product of the resistance of R18 and the capacitance of C8 ($dV/dt \approx V$ at node $374/(R18 \times C8)$).

The following discussion illustrates differences between surge suppression circuits 210 and 310. In the current limiting circuits 218, 218' a limited constant magnitude current 282 charges the bypass capacitors 158, 162. In contrast, the slew rate control circuit 318, 318' holds constant the rate of charging the power bypass capacitors 158, 162 by varying the magnitude of current 354 into surge connection 238 substantially independently of the capacitance of the bypass capacitor 158. Consequently, relatively little current 354 is used when the power bypass capacitance 158 is small and a relatively large current 354 is used when the power bypass capacitance 158 is large. In the current limiting circuit 218, the current 282 is held substantially constant, but the time spent charging the power bypass capacitance 158 is a function of the size of the power bypass capacitance.

The slew rate control circuit 318 does not experience the hard turn-on of transistor 276 as described above, since it does not use a current limiting transistor such as transistor 285. Furthermore, the slew rate control circuit 318 does not use a current sensing resistor R9. The absence of a voltage drop across a current sensing resistor R9 permits the slew rate control circuit 318 to charge the power bypass capacitance 158 closer to the power supply voltage 125, prior to the power supply leafs of the plug 150 making contact with the short 5-volt contact leafs of the receptacle 138.

Moreover, in the current limiting circuit 218, the voltage at surge connection 238 tends to increase to approach full charge asymptotically. This type of charging tends to occur when some of the disk drive's 154 circuits begin drawing current from the power supply 125 as the power bypass capacitance 158 is being charged. But under similar circumstances, the slew rate control circuit 318 maintains a substantially constant current 354 for charging the power bypass capacitor 158.

Figure 4:
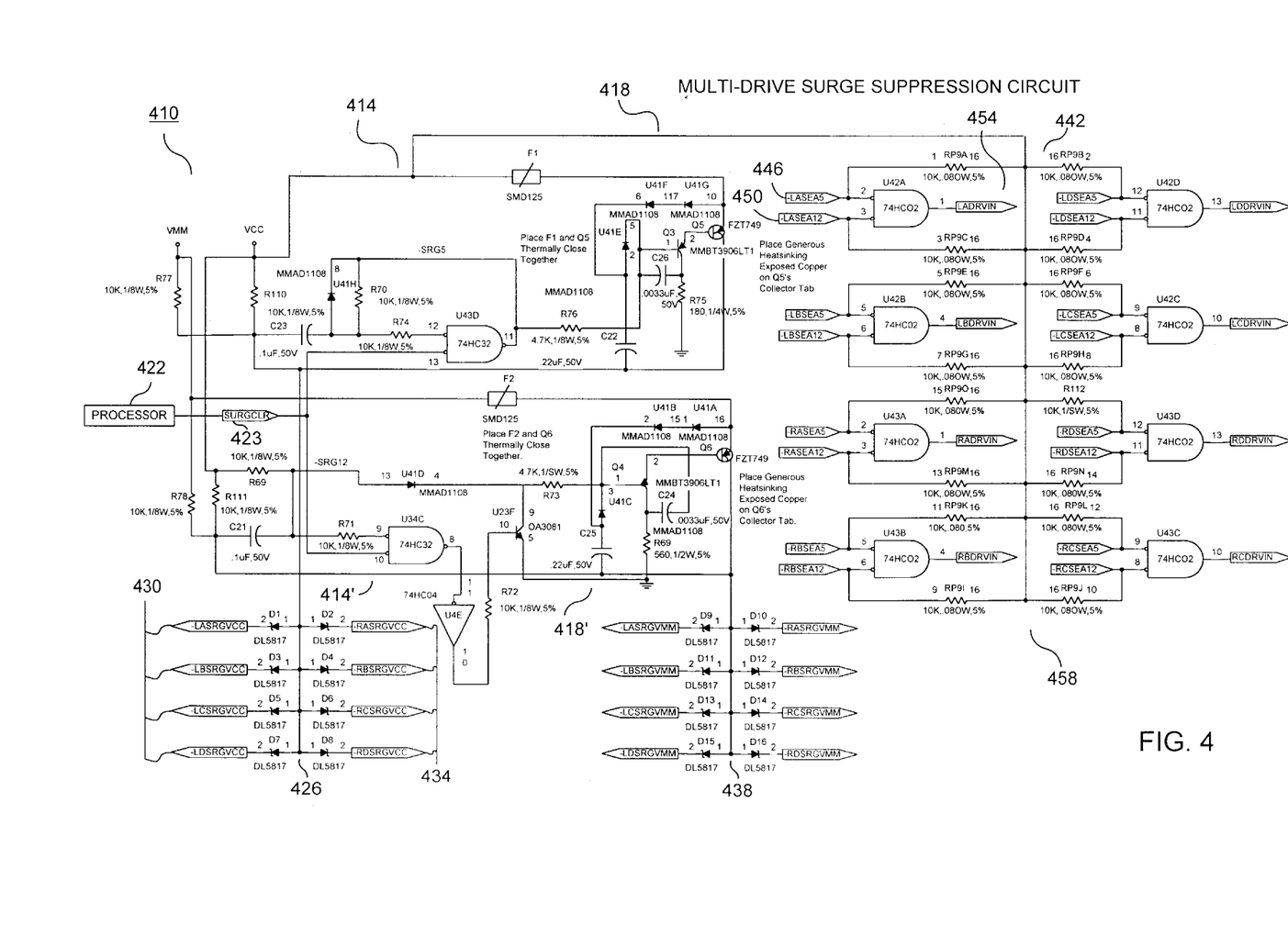
FIG. 4 is a circuit diagram of a surge suppression circuit for multiple disk drives, in accordance with a preferred embodiment of the invention.

FIG. 4 shows a circuit diagram for surge suppression for multiple devices, such as disk drives 154. FIG. 4 shows such a multi-drive surge suppression circuit 410. Based on the description of trigger circuits 314 and 314' in connection with FIG. 3, one of ordinary skill in the art will understand based on the description herein trigger circuits 414 and 414'.

Similarly, one of ordinary skill in the art will understand based on the description of slew rate control circuits 318 and 318' in connection with the description of FIG. 3 the function of slew rate control circuits 418 and 418'.

In FIG. 4, instead of employing capacitor C2, and resistors R5 and R6 in trigger circuit 314 and capacitor C5 and resistors R14 and R15 in trigger circuit 314', the trigger circuits 414 and 414' are coupled to a microprocessor 422 via clearing connection 423. Except as discussed further below, microprocessor 422 pulls to ground the clearing connection 423.

Surge suppression circuit 410 provides the surge suppression function to four left and four right disk drives each with a 5 volt and a 12 volt power supplies. A bank of surge connections 426 has four left surge connections 430 and four right surge connections 434, instead of a single connection, such as connection 238. The connections 430 lead to left disk drives, whereas the connections 434 lead to the right disk drives in, for instance, a RAID system. A similar bank of connections 438 is shown for the 12 volt power supplies replacing a single connection, such as connection 246 of FIG. 3b.

Isolation diodes, specifically Schottky diodes, isolate surge connections 430, 434 from each other in surge connection banks 426, 438. Using Schottky diodes is advantageous because they have a voltage drop of only about 0.5 volts. Consequently, once the capacitance of a particular power supply has been charged by the surge suppression circuit 410, then there will only be a small jump of about 0.5 volts when the power supply leafs of plug 150 make contact with the short power supply leafs, such as power supply leafs No. 34 and No. 35 of receptacle 138, as discussed above.

Once plug 150 is seated in receptacle 138, microprocessor 422 waits for approximately 10 milli-second to ensure that a particular disk drive 154 is seated completely. Once a particular disk drive 154 is completely seated, the processor 422 applies a high voltage, i.e., a clearing signal, at clearing connection 423 for 10 milli-seconds. The particular length of time for applying a high voltage at connection 423 is a function of the time constants associated with the resistors and capacitors in the surge suppression circuit 410. Following the 10 milli-second time interval of applying a high voltage at clearing connection 423, the microprocessor 422 again pulls clearing connection 423 to ground. As discussed above, in connection with corresponding gates in other embodiments of the invention, a high voltage applied at pins 2 and 3 of gates U34D and U34C, respectively, resets trigger circuits 414 and 414'.

The microprocessor determines when a disk drive is seated by polling seating information from connections 454 in left seating circuit 442 and right seating circuit 458. Left seating circuit 442 is associated with the left bank of disk drives, whereas the right seating circuit 458 is associated with the right bank disk drives in the RAID system. To illustrate, once plug 150 is seated in receptacle 138, connections 446 and 450 are both at ground. Connections 446 and 450 mate with short ground 5 volt power supply contact leafs No. 73 and 12 volt power supply contact leafs No. 47 in receptacle 138. These short ground contact leafs No. 73 and No. 47 are selected to be spaced far apart, such that both connections 446 and 450 will be grounded only when plug 150 is substantially seated in receptacle 138 instead of being at some angle at which only one of connections 446 or 450 would be grounded. Once both seating connections 446 and 450 have been pulled to ground, connection 454 goes to a high voltage, thereby indicating to microprocessor 422 that the left drive associated with connection 454 has been completely seated.

Several preferred embodiments of the present invention have been described. Nevertheless, it will be understood that various modifications may be made without departing from the spirit and scope of the invention. For example, the discussion above has been in terms of a 5 volt and a 12 volt power supplies 125, 126. However, as will be clear to one of ordinary skill in the art based on the above description, in other embodiments, the surge suppression circuits 110, 210, 310, and 410 can be modified for power supplies with other voltages. Thus, the present invention is not limited to the preferred embodiments described herein, but may be altered in a variety of ways, which will be apparent to persons skilled in the art based on the present description.

What is claimed is:

1. An apparatus for charging a capacitance having a first and a second potentials operable with a power supply having a first and a second potentials, the apparatus comprising:
   a trigger circuit for coupling to the capacitance and for coupling to the power supply; and
   a current control circuit coupled to the trigger circuit, the current control circuit for coupling to the capacitance and for coupling to the power supply for substantially ceasing to conduct current when the capacitance is charged to a third potential.

2. The apparatus of claim 1, wherein the current control circuit comprises a current limiting circuit.

3. The apparatus of claim 1, wherein the current control circuit comprises a slew rate control circuit.

4. The apparatus of claim 1, wherein the first potential is substantially identical to the third potential.

5. The apparatus of claim 2, wherein the current limiting circuit includes
   a transistor for coupling between the first potential of the power supply and the first potential of the capacitance, and
   a feedback system coupled to the transistor for gradually turning on the transistor.

6. An apparatus for charging a capacitance having a first and a second potentials operable with a power supply having a first and a second potentials, the apparatus comprising:
   a trigger circuit for coupling to the capacitance and for coupling to the power supply; and
   a current limiting circuit coupled to the trigger circuit, the current limiting circuit for coupling to the capacitance and for coupling to the power supply, wherein the current limiting circuit comprises
     a current sensing resistor for coupling to the first potential of the power supply,
     a first transistor coupled to the current sensing resistor, and
     a second transistor coupled to the current sensing resistor, to the first transistor, and for coupling to the first potential of the capacitance for charging the capacitance substantially to the first potential of the power supply.

7. The apparatus of claim 6, wherein the current limiting circuit further comprises:
   a third transistor coupled to the second transistor;
   a first capacitor coupled to the third transistor and to the first and second transistors; and
   a resistor coupled to the first capacitor, the first capacitor and the resistor for gradually turning on the third transistor for gradually turning on the second transistor.

8. An apparatus for charging a capacitance having a first and a second potentials operable with a power supply having a first and a second potentials, the apparatus comprising:

a trigger circuit for coupling to the capacitance and for coupling to the power supply; and a current control circuit coupled to the trigger circuit, the current control circuit for coupling to the capacitance and for coupling to the power supply, wherein the trigger circuit comprises an AND gate having a first and second inverted ports and a third port, the first and second ports for coupling to the first and second potentials, respectively, of the capacitance, the third port coupled to the current control circuit and to the first port of the AND gate.

9. The apparatus of claim 8, wherein the trigger circuit further comprises:

a first resistor coupled to the first inverted port of the AND gate;

a first capacitor coupled to the first resistor and for coupling to the first potential of the capacitance;

a second capacitor coupled to the second inverted port of the AND gate and for coupling to the second potential of the capacitance; and a second resistor coupled to the second capacitor and for coupling to the second potential of the power supply.

10. The apparatus of claim 9, wherein the resistance of the first resistor and the capacitance of the first capacitor comprise a first time constant, wherein the resistance of the second resistor and the capacitance of the second capacitor comprise a second time constant, and wherein the second time constant is significantly greater than the first time constant.

11. An apparatus for charging a capacitance having a first and a second potentials operable with a power supply having a first and a second potentials, the apparatus comprising:

a trigger circuit for coupling to the capacitance and for coupling to the power supply; and a slew rate control circuit coupled to the trigger circuit, the slew rate control circuit for coupling to the capacitance and for coupling to the power supply, wherein the slew rate control circuit comprises a slew rate capacitor, a slew rate resistor coupled to the slew rate capacitor, and a first transistor coupled to the slew rate capacitor and to the slew rate resistor, the first transistor for coupling to the first potential of the power supply and for coupling to the first potential of the capacitance.

12. The apparatus of claim 11, wherein the slew rate control circuit further comprises:

a second transistor coupled to the first transistor;

a second capacitor coupled to the second transistor, to the slew rate resistor, and to the slew rate capacitor for gradually turning on the first and second transistors.

13. The apparatus of claim 12, wherein the first and second transistors are coupled to each other in a semi-Darlington configuration.

14. The apparatus of claim 11, further comprising a first and a second diode coupled between the first transistor and the slew rate capacitor.

15. An apparatus for charging a capacitance having a first and a second potentials operable with a power supply having a first and a second potentials, the apparatus comprising:

a trigger circuit for coupling to the capacitance and for coupling to the power supply; and a current control circuit coupled to the trigger circuit, the current control circuit for coupling to the capacitance and for coupling to the power supply, wherein the trigger circuit further comprises a clearing connection for coupling to a processor.

16. The apparatus of claim 15, further comprising a first and second diodes having anodes coupled to each other and to the clearing connection.

17. The apparatus of claim 15, further comprising a first and a second seating connection coupled to an AND gate having a seating signal connection for coupling to the processor.

18. A process for charging a capacitance having a potential operable with a power supply having another potential, the process comprising the steps of:

generating a trigger signal based on the capacitance being coupled to the power supply;

following the generation of the trigger signal, charging the capacitance at a controlled rate; and directly coupling the capacitance to the potential of the power supply, once the capacitance is substantially charged to the potential of the power supply.

19. The process as recited in claim 18, wherein the step of charging the capacitance at a controlled rate includes charging the capacitance at a substantially constant rate of change of voltage.

20. The process as recited in claim 18, wherein the step of charging the capacitance at a controlled rate includes charging the capacitance at a substantially constant current.

21. An apparatus for charging a capacitance having a potential operable with a power supply having another potential, the apparatus comprising:

means for generating a trigger signal based on the capacitance being coupled to the power supply;

means for, following the generation of the trigger signal, charging the capacitance at a controlled rate; and means for directly coupling the capacitance to the potential of the power supply, once the capacitance is substantially charged to the potential of the power supply.

22. The apparatus of claim 19, where the means for charging the capacitance at a controlled rate includes means for charging the capacitance at a substantially constant rate of change of voltage.

23. The apparatus of claim 19, where the means for charging the capacitance at a controlled rate includes means for charging the capacitance at a substantially constant current.

24. An apparatus for charging a capacitance having a first and a second potentials operable with a power supply having a first and a second potentials, the apparatus comprising:

a current sensing resistor for coupling to the first potential of the power supply;

a first transistor coupled to the current sensing resistor; and a second transistor coupled to the current sensing resistor, to the first transistor, and for coupling to the first potential of the capacitance for charging the capacitance substantially to the first potential of the power supply.

25. The apparatus of claim 24, further comprising:

a third transistor coupled to the second transistor;

a first capacitor coupled to the third transistor and to the first and second transistors; and a resistor coupled to the first capacitor, the first capacitor and the resistor for gradually turning on the third transistor for gradually turning on the second transistor.

26. An apparatus for charging a capacitance having a first and a second potentials operable with a power supply having a first and a second potentials, the apparatus comprising:

a slew rate capacitor;

a slew rate resistor coupled to the slew rate capacitor; and a slew rate circuit coupled to the slew rate capacitor and the slew rate resistor;

a first transistor coupled to the slew rate circuit, the first transistor for coupling to the first potential of the power supply and for coupling to the first potential of the capacitance, wherein the first transistor operates in conjunction with the slew rate circuit to charge the capacitance at a substantially constant rate.

27. The apparatus of claim 22, further comprising:

a second transistor coupled to the first transistor;

a second capacitor coupled to the second transistor, to the slew rate resistor, and to the slew rate capacitor for gradually turning on the first and second transistors.

28. The apparatus of claim 27, wherein the first and second transistors are coupled to each other in a semi-Darlington configuration.

29. The apparatus of claim 26, further comprising a first diode coupled between the first transistor and the slew rate capacitor.

30. The apparatus of claim 29, further comprising a second diode serially coupled to the first diode.

31. The apparatus of claim 26, further comprising a diode coupled between the slew rate capacitor and the slew rate resistor.

* * * * *